Sept. 22, 1959 J. SANDERS 2,905,907

GATED COHERENT OSCILLATOR

Filed Sept. 4, 1956 2 Sheets-Sheet 1

INVENTOR.
Jack Sanders,
BY.

ATTORNEY.

Sept. 22, 1959 J. SANDERS 2,905,907

GATED COHERENT OSCILLATOR

Filed Sept. 4, 1956 2 Sheets-Sheet 2

INVENTOR.
Jack Sanders,
BY
ATTORNEY.

2,905,907

GATED COHERENT OSCILLATOR

Jack Sanders, Los Angeles, Calif., assignor to Hughes Aircraft Company, Culver City, Calif., a corporation of Delaware Application September 4, 1956, Serial No. 608,650

5 Claims. (Cl. 331—173)

This invention relates to oscillators and more particularly to a gated coherent oscillator which may be started very precisely in coincidence with a control pulse.

A coherent oscillator is required in certain radar pulse echo receiving systems where it is necessary to distinguish echoes of moving objects in the field of illumination of the transmitter of the radar system from stationary objects in the same field. The coherent oscillator must be started precisely at a predetermined time with respect to the transmitted radar pulse for each transmitted pulse. Conventionally the coherent oscillator is gated, that is, it is started and stopped for predetermined intervals. The gated oscillator is used as a receiver local oscillator in a radar system and so renders the receiver operative while the oscillator is in operation.

It is an object of this invention to provide a gated coherent oscillator in which each start of the oscillator is made to occur precisely coincident with a predetermined control pulse.

It is another object of this invention to provide a coherent oscillator in which a starting control pulse system is utilized and in which the control pulse system exerts no influence on the frequency determining parameters of the oscillator.

It is still another object of this invention to provide a precisely controlled gated coherent oscillator wherein the frequency determining network is a series resonant circuit including an inductor and a capacitor.

It is yet another object of this invention to provide a gated coherent oscillator, the starting time of which is precisely controlled by a pulse burst of a frequency near to, but not necessarily exactly the same as the oscillator frequency.

This invention generally contemplates a gated oscillation generator wherein the starting of the oscillations is made coincident with a gating pulse by the application of a pulse burst at a frequency near the oscillation frequency simultaneously with the gating pulse and circuit means for so doing.

These and other objects of this invention will be more apparent from the following description taken together with the accompanying drawings and as defined in the appended claims. In the drawings:

In general, when an oscillator circuit is initially activated the oscillations do not reach maximum amplitude instantaneously, but rather, gradually build up to operating amplitude over a relatively short but definite time interval. Thus a gated oscillator, that is, one in which the oscillator is periodically activated and deactivated, will not start precisely at the instant of gating but will build up gradually to its full amplitude in the manner shown in Fig. 2, wavetrain D. Referring to wavetrain D, the initial application of activating potentials in an oscillator would occur at starting time 0 as shown at 210.

A gradual rise in the amplitude as shown at 211 takes place and it is some time after the power has been applied to start the oscillator before the oscillator output signal reaches full amplitude as shown at 212.

Figure 2:
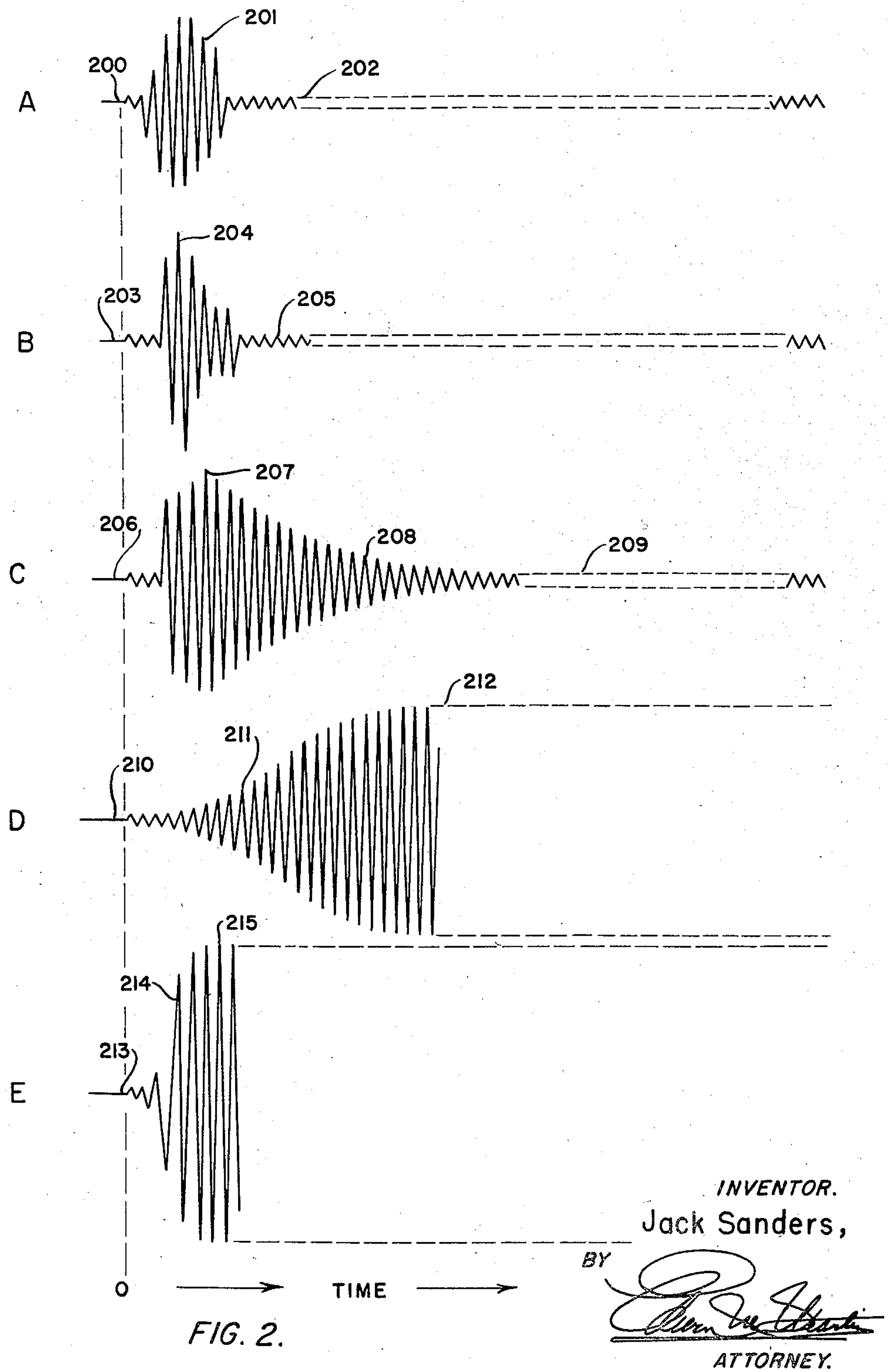
Fig. 2 shows a series of waveforms illustrative of the operation of the circuit of Fig. 1.

An oscillator operating as shown by wavetrain D of Fig. 2 is undesirable when used in connection with the detection of echo pulses from moving objects in a radar illuminated field having also stationary objects because in such an operating condition the interval between the starting time 210 and the arrival at full amplitude of oscillation as at 212 may not be at the same time for each transmitted pulse of the radar system. This, in turn, will cause improper indication in time of the target location on the display system and both still and moving targets will have different positions in the display, whereas the still objects should have the same position and moving objects should change position.

The waveform of a desirable form of starting wavetrain for a coherent oscillator is shown in Fig. 2 wavetrain E. Note that there is an almost instantaneous rise to full amplitude in wavetrain E, as at 214 from the starting time 213 to full amplitude at 215.

When a coherent oscillator is started and stopped it should have the wave envelope such as shown in Fig. 2 wavetrain E for the starting condition.

Prior art circuits for controlling coherent oscillators are shown, for example, in Fig. 16.27, p. 664 of "Radar System Engineering" by Ridenour, vol. 1 of the M.I.T. Radiation Laboratory Series, published by McGraw Hill, New York, 1947. In such a prior art circuit when a control pulse is applied to an oscillator producing a wave of the type such as shown in Fig. 2 wavetrain E, there is amplitude modulation of the starting wave by the control pulse and consequently the start of the oscillator for any particular control pulse may vary with respect to preceding or successive pulses. When a coherent oscillator must be used in connection with a moving object radar detection system this variation is intolerable. The oscillator must start as nearly simultaneously with the control pulse as possible in order to distinguish echoes of moving objects from echoes of fixed objects.

Figure 1:
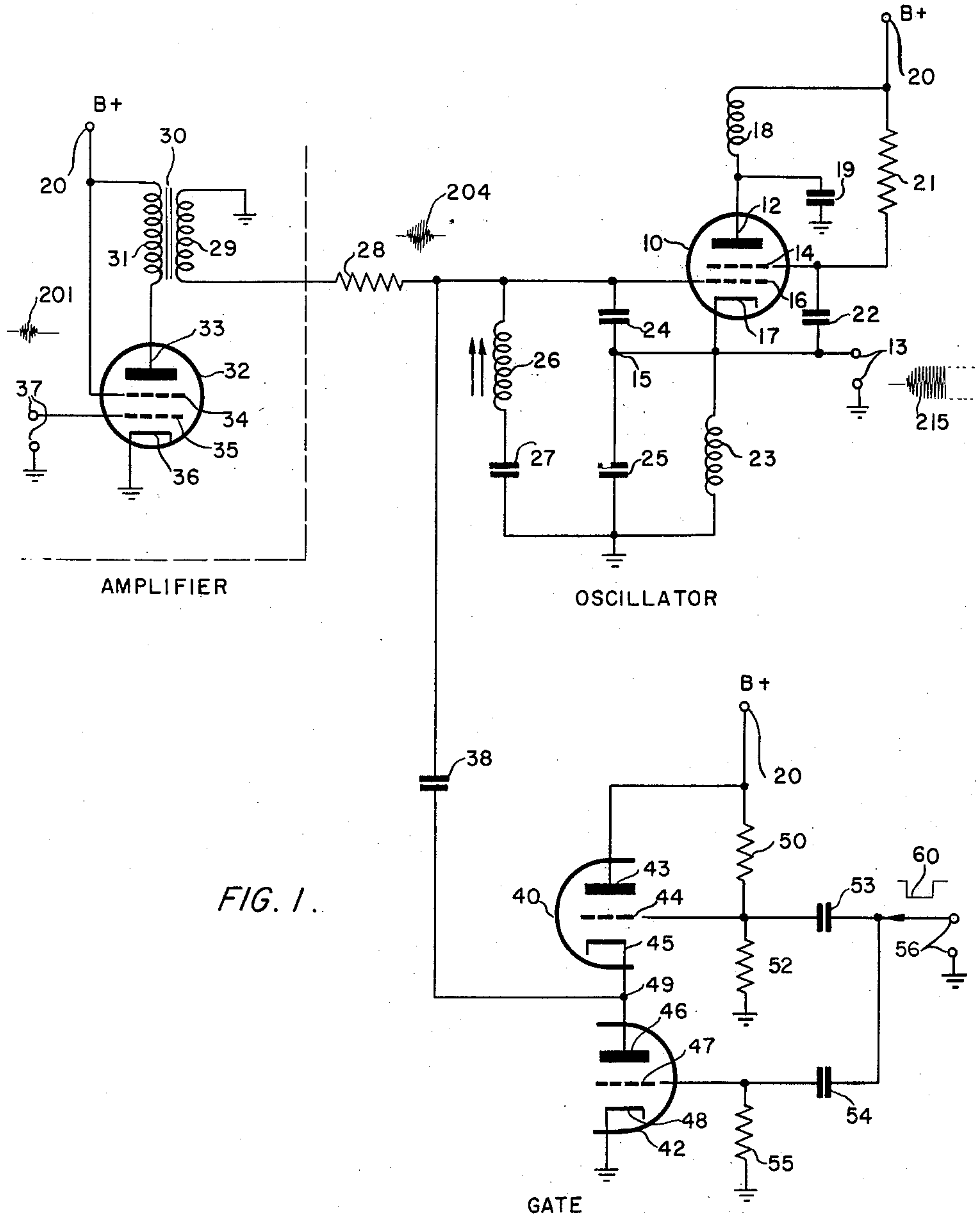
Fig. 1 is a schematic circuit diagram of an embodiment of this invention.

The circuit shown in Fig. 1 and embodying the present invention accomplishes the desired result. In Fig. 1 an oscillator tube 10 is shown. Oscillator tube 10 includes an anode 12, a screen grid 14, a control grid 16 and a cathode 17. While oscillator tube 10, as shown is a tetrode, it may be a triode or pentode as well. An RF choke coil 18 is connected between anode 12 and a source of positive potential B+ indicated at 20. An RF bypass capacitor 19 is connected between anode 12 and ground. A screen voltage dropping resistor 21 is connected between screen grid 14 and positive potential source 20. A screen by-pass capacitor 22 is connected between screen grid 14 and cathode 17. An RF choke coil 23 is connected between cathode 17 and ground. A pair of capacitors 24 and 25 are connected in series between control grid 16 and ground. The junction 15 of capacitors 24, 25 is connected to cathode 17 of oscillator tube 10. A series resonant circuit comprising series connected adjustable inductor 26 and capacitor 27 is connected between control grid 16 and ground in parallel with series connected capacitors 24, 25.

A locking pulse amplifier tube 32 has an anode 33, a screen grid 34, a control grid 35 and a cathode 36. Cathode 36 is connected to ground. Control grid 35 is connected to a locking pulse burst input circuit 37 shown schematically. Screen grid 34 is connected to source of positive potential 20. The primary winding 31 of a coupling transformer 30 is connected between anode 33 and positive potential source 20. Secondary winding 29 of transformer 30 is connected between an isolation resistor 28 and ground. The other end of isolation resistor 28 is connected to control grid 16 of oscillator tube 10.

A gating or clamp circuit comprising a pair of series connected triodes 40 and 42 is coupled by the junction 49 thereof through capacitor 38 to the grid 16 of oscillator tube 10. The upper tube 40 of the clamp circuit has an anode 43, a control grid 44 and a cathode 45. The lower tube 42 of the clamp circuit has an anode 46, a control grid 47 and a cathode 48. Anode 43 of the upper tube 40 is connected to source of positive potential 20, the cathode 45 of upper tube 40 and anode 46 of lower tube 42 are connected together to form junction 49. A dropping resistor 50 is connected between positive potential source 20 and grid 44 of tube 40. A grid leak resistor 52 is connected from grid 44 to ground. Resistors 52 and 50 form a voltage divider for providing an appropriate bias on grid 44 of tube 40 with respect to its cathode 45. Grid leak resistor 55 is connected between grid 47 of tube 42 and ground. A pair of capacitors 53 and 54 are connected from gating pulse input terminals 56 to grids 44 and 47 respectively of the upper and lower tubes 40 and 42.

Referring to Fig. 1 in conjunction with the wavetrains of Fig. 2, the operation of the oscillator of Fig. 1 will now be explained. A pulse burst 201, as shown at A in Fig. 2, at a frequency near the desired operating frequency of oscillator 10 may be applied to input circuit 37 of pulse amplifier 32. The burst 201 has a predetermined duration as shown between 200 and 202, and after being amplified by virtue of the amplifying action of amplifier 32 appears at the junction of grid 16 and coil 26 with a wave envelope as shown in Fig. 2, wavetrain B, at 204. When oscillator 10 is not operative the series resonant circuit including inductor 26 and capacitor 27 will ring for the period from 203 to 205 in response to the pulse burst 204 as shown in Fig. 2, wavetrain C, starting at 206, rising to a peak 207 and decay exponentially as shown at 208 to the quiescent condition 209.

When oscillator 10 is operative in a manner to be described hereinafter in the absence of the pulse burst 204 its starting wavetrain output shape as seen at output terminals 13 would appear as shown in Fig. 2 wavetrain D. The wavetrain D of Fig. 2 has been previously described.

Gate tubes 40 and 42 are maintained normally conducting by positive bias derived from voltage divider 50, 52 and the grid leak 55.

The initiation of the operation of the oscillator 10 occurs in response to the deenergization of gate tubes 40 and 42 by negative going pulse 60 at the same time as the application of burst 204 to oscillator 10 results in an output signal wavetrain as shown at E in Fig. 2. Tube 42 when conducting is a low impedance from grid 16 to ground of oscillator tube 10. Note that from the quiescent condition 213 there is a sharp almost instantaneous rise 214 in amplitude to the peak amplitude 215.

Gating pulses 60 (Fig. 1) are applied to gate circuit tubes 40 and 42, at input circuit 56. The gating pulses 60 have a duration determined by the external system requirements.

The gate circuit, that is, tubes 40 and 42, when in the quiescent state, is normally conducting. In this condition the gate circuit presents a low impedance through capacitor 38 and tube 42 to ground, for the resonant circuit consisting of inductor 26 and capacitor 27 to effectively short-circuit the oscillator 10, and keep it in an inoperative condition. When gate pulses 60 are applied to input 56 of the gate circuit the gate circuit is rendered nonconductive, whereupon the gate circuit becomes a high impedance as seen from the grid 16 of oscillator 10 and oscillations will start due to transient conditions in the circuit. The high impedance results from the fact that the nonconductive tubes 42 and 40 are essentially an open circuit. Gate pulses 60, applied at input 56, are coincident in time with pulse bursts 201 applied at input 37. Thus the amplified burst pulse 204 arrives at grid 16 of oscillator 10 at the start of the period in which oscillator 10 is just building up and causes series resonant circuit 26, 27 to ring instantaneously and bring the oscillation of oscillator 10 to full amplitude substantially at once as shown by wavetrain E.

There has been described herein a coherent oscillator circuit wherein the start of a pulsed oscillator is controlled by pulse bursts coincident with controlling pulses to reach maximum oscillation amplitude almost instantaneously.

What is claimed as new is:

1. A coherent oscillation generator comprising: an oscillator having a frequency determining circuit; a source of gating pulses; a normally conducting gate circuit coupled to said frequency determining circuit and to said source of gating pulses, and responsive thereto to become nonconducting in the presence of gating pulses from said source, said gate circuit providing substantially a short circuit across said frequency determining circuit when conducting and an open circuit when nonconducting; a source of pulse bursts; a pulse burst amplifier, said amplifier being coupled to said frequency determining circuit for exciting said frequency determining circuit to ring at a predetermined frequency near the resonant frequency thereof; and an isolating resistor also connected between said amplifier and said frequency determining circuit; whereby when gating pulses from said source of gating pulses are applied to said gate circuit and pulse bursts from said source of pulse bursts are applied to said oscillator coincidentally with said gating pulses the start of said oscillator is instantaneous therewith.

2. A coherent oscillation generator comprising: an oscillator; a frequency determining circuit including a series resonant circuit, a pair of capacitors in series connected in parallel with said series resonant circuit, said frequency determining circuit being connected to said oscillator to accurately control the frequency thereof; a source of gating pulses; a normally conducting gate circuit coupled to said frequency determining circuit and to said source of gating pulses, and responsive to said gating pulse to become nonconducting in the presence of gating pulses from said source, said gate circuit providing substantially a short circuit across said frequency determining circuit when conducting and an open circuit when nonconducting; a source of pulse bursts; a pulse burst amplifier, said amplifier being coupled to said frequency determining circuit for exciting said frequency determining circuit to ring at a predetermined frequency near the resonant frequency thereof; and said amplifier including an isolating resistor for isolating said frequency determining circuit; whereby when gating pulses from said source of gating pulses are applied to said gate circuit and pulse bursts from said source of pulse bursts are applied to said oscillator coincidentally the start of said oscillator is instantaneous therewith.

3. A coherent oscillation generator comprising: an oscillator having a resonant frequency determining circuit in the grid circuit thereof; a source of pulse bursts coupled to said frequency determining circuit; an isolation resistor connected between said source of pulse bursts and said frequency determining circuit; and gating means coupled to said frequency determining circuit and controlled by control pulses whereby said frequency determining circuit is excited by said pulse bursts to cause oscillation upon the coincident occurrence of said pulse bursts and control pulses.

4. A coherent oscillation generator comprising: an oscillator tube having a resonant frequency determining circuit; gating means to control current through said frequency determining circuit; a source of gating pulses to control said gating means; a source of pulse bursts coupled to said frequency determining circuit to rapidly cause build up of oscillations; and an isolation resistor connected between said source of pulse bursts and said frequency determining means so that said frequency determining means does not affect the operation of the oscillator, while rapidly causing build up of oscillations.

5. A coherent oscillation generator comprising: an oscillator tube; a series resonant circuit tuned to control oscillations of said oscillator tube; a tuned source of pulse bursts being near to the frequency of said series resonant circuit, said source comprising an isolation resistor connected between said source of pulse bursts and said series resonant circuit; a gate connecting a source of impedance to said series resonant circuit between said isolation resistor and said series resonant circuit; and gating signals to control the impedance of said gate, whereby said oscillator is rapidly brought to oscillation by said pulse bursts when said gate is opened by said gating signals.

References Cited in the file of this patent

UNITED STATES PATENTS

| | | |
|---|---|---|
| 2,456,016 | Owen | Dec. 14, 1948 |
| 2,495,115 | Mayer | Jan. 17, 1950 |
| 2,597,796 | Hindall | May 20, 1952 |
| 2,676,251 | Scarbrough | Apr. 20, 1954 |